United States Patent
Akimoto (10) Patent No.: US 7,280,225 B2
(45) Date of Patent: Oct. 9, 2007

(54) STAGE APPARATUS AND CONTROL METHOD INCLUDING FIRST AND SECOND MEASUREMENT SYSTEMS FOR MEASURING A STAGE POSITION AND A SWITCHING UNIT FOR SWITCHING BETWEEN THE MEASUREMENT SYSTEMS

(75) Inventor: Satoshi Akimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 227 days.

(21) Appl. No.: 11/062,585

(22) Filed: Feb. 23, 2005

(65) Prior Publication Data
US 2005/0190375 A1   Sep. 1, 2005

(30) Foreign Application Priority Data
Feb. 27, 2004 (JP) ............... 2004-054634

(51) Int. Cl.
G01B 9/02 (2006.01)
(52) U.S. Cl. .................................... 356/500
(58) Field of Classification Search ............... 355/75, 355/72, 53; 356/514, 500, 498, 511, 508
See application file for complete search history.

(56) References Cited
U.S. PATENT DOCUMENTS

| | | | |
|---|---|---|---|
| 6,819,433 B2 | 11/2004 | Takai et al. ........... | 356/500 |
| 6,864,963 B2 * | 3/2005 | Chen et al. ........... | 355/75 |
| 7,042,576 B2 * | 5/2006 | Hattori ............ | 356/500 |
| 2002/0109850 A1 | 8/2002 | Takai et al. ............ | 356/500 |
| 2003/0142321 A1 * | 7/2003 | Hattori ............ | 356/500 |
| 2005/0190375 A1 | 9/2005 | Akimoto ............ | 356/500 |

FOREIGN PATENT DOCUMENTS
JP    2002-319541    10/2002

* cited by examiner

*Primary Examiner*—Hwa (Andrew) Lee
(74) *Attorney, Agent, or Firm*—Fitzpatrick, Cella, Harper & Scinto (57) ABSTRACT

A stage apparatus including a stage movable in a first direction and a second direction, different from the first direction, the first and second directions being a horizontal direction, and first and second measurement systems each having a laser interferometer and a mirror system including a first reflecting mirror elongated in the first direction and a second reflecting mirror elongated in the second direction, and measuring a position of the stage with respect to a vertical direction based on measurement of a length of a laser beam light path formed by the mirror system. A switching unit transfers a measurement value from the first measurement system in use to the second measurement system and switches the measurement system in use from the first measurement system to the second measurement system within an overlapping zone of measurement systems. A first correcting unit corrects the transferred measurement value.

6 Claims, 7 Drawing Sheets

STAGE APPARATUS AND CONTROL METHOD INCLUDING FIRST AND SECOND MEASUREMENT SYSTEMS FOR MEASURING A STAGE POSITION AND A SWITCHING UNIT FOR SWITCHING BETWEEN THE MEASUREMENT SYSTEMS

FIELD OF THE INVENTION

The present invention relates to a stage apparatus and a control method for use with the stage apparatus, and, more particularly, to that which can optimally execute position measurement of a stage adapted to carry a semiconductor manufacturing mask or a substrate, such as a semiconductor wafer, or the like.

BACKGROUND OF THE INVENTION

In the photolithography process of semiconductor device manufacturing, an exposure apparatus is used to transfer the fine pattern of a reticle onto a wafer coated with a photo-sensitive material. The measurement of the position of a stage on which such a wafer is placed, and the stage drive, require a high degree of accuracy, and, therefore, a high-resolution laser interferometer and a reflecting mirror, which is the target of the laser beam, are used. In recent years, as semiconductor wafers have increased in diameter, the drive range of the stage has also increased, as has the length of the reflecting mirror.

However, increasing the length of the reflecting mirror leads to the following problems:

(1) In terms of manufacture and installation, it is difficult to achieve a nearly perfectly flat surface;

(2) Even when it is possible to achieve a nearly perfectly flat surface, the cost is prohibitive; and (3) as the characteristic value of the reflecting mirror decreases, the band of control deteriorates.

In addition, the exposure apparatus is loaded with a large number of units, such as a projection optical system, a focus/leveling measurement system, and an alignment measurement system, an illumination system, and so forth. At the same time, the laser interferometer becomes inoperative if the light path is obstructed. As a result:

(4) the positioning of the laser interferometer and the reflecting mirror may be limited by the balance with the other units. In particular, with respect to the disposition of the laser interferometer and the reflecting mirror for measuring the position in the direction of the optical axis of the projection optical system (hereinafter the "Z axis"), there are many limitations, because most of the units are concentrated near the projection lens.

As one solution to the aforementioned problem, there is, for example, the construction shown in Japanese Laid-Open Patent Publication No. 2002-319541, in which positioning along the Z axis is measured by switching between a plurality of interferometers. In the apparatus described in Japanese Laid-Open Patent Publication No. 2002-319541, shown are an example of a configuration for measuring a position along the Z axis, implementing Z-axis measurement by using a plurality of laser interferometers and a plurality of reflecting mirrors, and switching interferometers while driving the stage in the direction of the Y axis. As a result of such a configuration, measurement of position in the Z axis is possible, no matter where the stage is in the X-Y plane.

When switching between interferometers, the coordinate systems of the interferometers switch. Accordingly, if just the interferometer to be used is switched, there is the possibility of a discontinuity in measurements just before and just after the switch, and, thus, it is necessary to insure the continuity of measurements when switching. For example, Japanese Laid-Open Patent Publication No. 2002-319541 describes providing overlapping intervals measurable by multiple lasers in order to prevent the occurrence of measurement discontinuity, such as that which occurs just before and just after switching, by inheriting a measurement result just before switching to a measurement result just after switching. However, because the reflecting mirrors placed in the light paths of the laser interferometers are not perfectly flat, but differ in shape from one mirror to the next, simply continuing measurements alone causes misalignments to occur. As a result, in, for example, the exposure apparatus, if such misalignments occur along the X, Y axes (that is, in the direction of movement of the X-Y stage (the wafer stage)), they can cause an accumulated error, and if such misalignments occur along the Z axis, they can cause a focusing error.

In particular, as patterns have become more detailed in recent years, ever greater position measurement accuracy is required. In addition, the position in the direction of the Z axis of a stage moving in the X-Y plane, where determined by switching between a plurality of interferometers, involves the use of reflecting mirrors extended along the X axis and reflecting mirrors extended along the Y axis in order to cover the range of motion of the stage, and, thus, the effects of the shapes of the surfaces of the mirrors are different for the X-axis position and the Y-axis position. For example, when switching interferometers at the same X-axis position, the Y-axis position might be different, and if the Y-axis position is different, the affect of the shape of the surface of the reflecting mirrors also is different.

SUMMARY OF THE INVENTION

The present invention is conceived as a solution to the problem described above, and has as its object to reduce misalignment occurring when switching between laser interferometers.

According to one aspect of the present invention, there is provided a stage apparatus, comprising a stage movable in a first direction, first and second measurement systems each having a laser interferometer and a mirror system including a first reflecting mirror elongated in the first direction, measuring a position of the stage with respect to a predetermined direction based on measurement of a length of a laser beam light path formed by the mirror system, a switching unit configured to transfer a measurement value from one system in use to the other system and to switch the measurement system in use between the first and second measurement systems within an overlapping zone in which the first and second measurement systems can simultaneously measure the position of the stage, and a first correcting unit configured to correct the measurement value transferred by the switching unit, based on a difference in the length of the light path due to a shape of a surface of the first reflecting mirror of the first and second measurement systems.

Other features, objects and advantages of the present invention are apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

Figure 1:
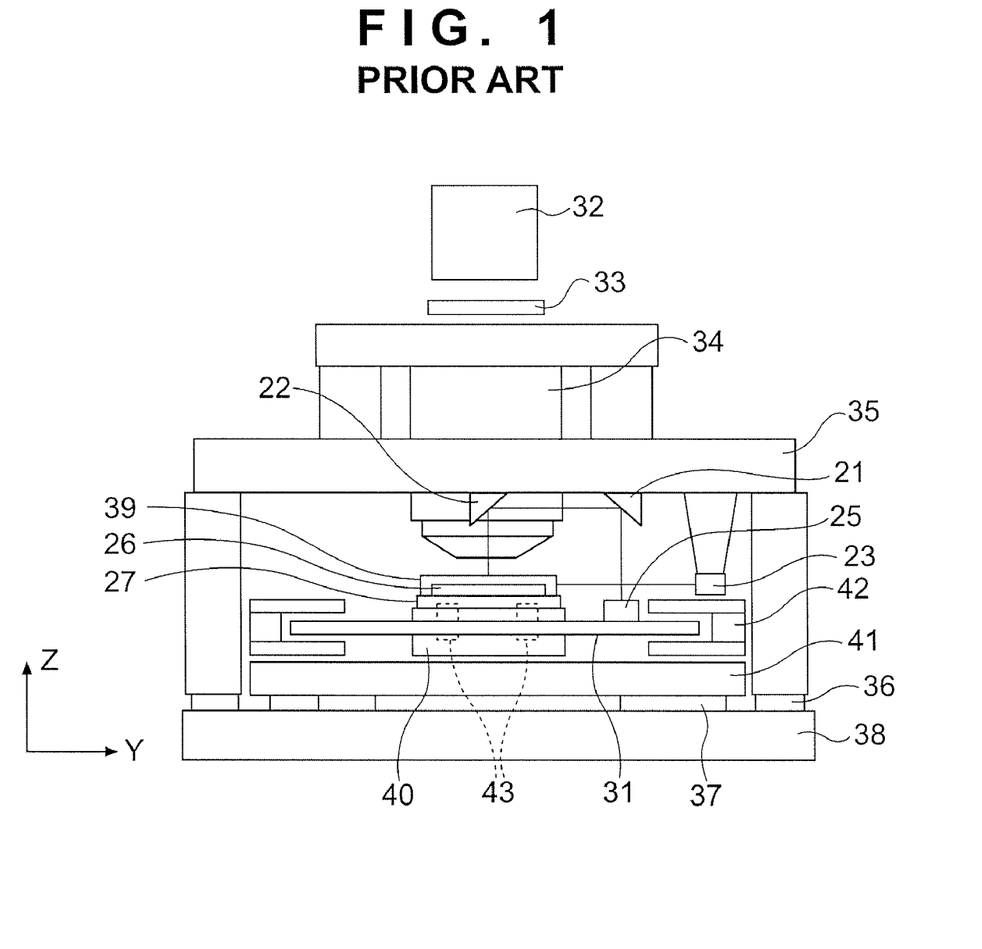
FIG. 1 is a schematic diagram showing the structure of an exposure apparatus according to an embodiment of the present invention.

FIG. 1 is a schematic front view of a semiconductor exposure apparatus according to one embodiment of the present invention. In FIG. 1, an illumination section 32 illuminates a reticle 33 that is an original plate. A pattern to be transferred is drawn on the reticle 33. A projection lens 34 (projection optical system) projects the pattern formed on the reticle 33 onto a wafer, not shown, which is a substrate placed atop a wafer chuck 26. The projection lens 34 is supported by a mirror barrel support 35. A main unit active mount 36 restrains vibration of the mirror barrel support 35 while supporting it and insulating it from vibration from the floor. A positioning table is provided with the main unit active mount 36 and a stage active mount 37.

Fixed mirrors 21, 22 used for Z-axis position measurement are fixedly mounted on the mirror barrel support 35. A mobile mirror 39 has two reflecting surfaces, and, as will be described with reference to FIG. 2 and FIG. 3, combines a Z-axis measurement mirror 30 and an X-axis measurement mirror 29. An X-stage 31 is movable in the direction of the X axis shown in FIG. 1. A Y-stage 40 is movable in the direction of the Y axis with respect to the X stage 31. A stage table 41 supports the Y-stage 40 and the X-stage 31. The stage active mount 37 suppresses vibrations of the stage table 41 caused by movement of the X-, Y-stages (31, 40). It should be noted that the stage table 41 supports the X-stage 31 and the Y-stage 40 without contact, using a hydrostatic bearing, not shown.

An X-linear motor 42 is used for stage driving, moving the stage 31 in the direction of the X axis. A moving element of the X-linear motor 42 is mounted on the X-stage 31 and a stator is mounted on the stage table 41. It should be noted that the stator of the X-linear motor 42 may be supported by a hydrostatic bearing, not shown, or the stator may be fixedly mounted on the stage base 41. In addition, there is a Y-linear motor, not shown, for driving the Y-stage 40 in the direction of the Y axis. It should be noted that a moving element of the Y-linear motor is mounted on the Y-stage 40 and a stator is mounted on the X-stage 31, generating a driving force in the direction of the Y axis between the X-stage 31 and the Y-stage 40.

A laser interferometer 23 measures the relative positions of the mirror barrel support 35 and a top stage 27 in the direction of the Y axis, and, moreover, measures the attitude of the top stage 27. Similarly, there is a laser interferometer 24, not shown in FIG. 1 (see FIG. 2 and FIG. 3) for measuring the relative positions of the mirror barrel support 35 and the top stage 27 in the direction of the X axis, as well as the attitude of the top stage 27. In addition, a Z measurement laser interferometer 25 is fixedly mounted on the X-stage 31, and measures the position of the top stage 27 in the direction of the Z axis by measuring the distance from the X-stage 31 to the mobile mirror 39 atop the top stage 27 using the mirrors 21, 22 fixedly mounted on the mirror barrel support 35.

It should be noted that the top stage 27 is placed atop the Y-stage 40, and is minutely movable with respect to the Y-stage 40 by an actuator, not shown. In addition, the position of the top stage 27 can also be measured by a Z-displacement sensor 43 mounted in the Y-stage 40. The Z-displacement sensor 43, which may be a linear encoder or an electrostatic capacitance sensor, is provided separately from the Z measurement laser interferometer 25, and measures the displacement of the top stage 27 with respect to the Y-stage 40 in three locations (the third of which is not shown), thus, permitting measurement of displacement of the top stage 27 along the Z axis, as well as displacement of the top stage 27 in the direction of tilt.

The wafer chuck 26 (also called a substrate holder) holds a semiconductor substrate (wafer), not shown, that is coated with a photosensitive material and which is the object of the pattern to be projected. The top stage 27, also called a θZ stage, positions the wafer chuck 26 in the Z, θ, ωX and ωY directions.

Figure 2:
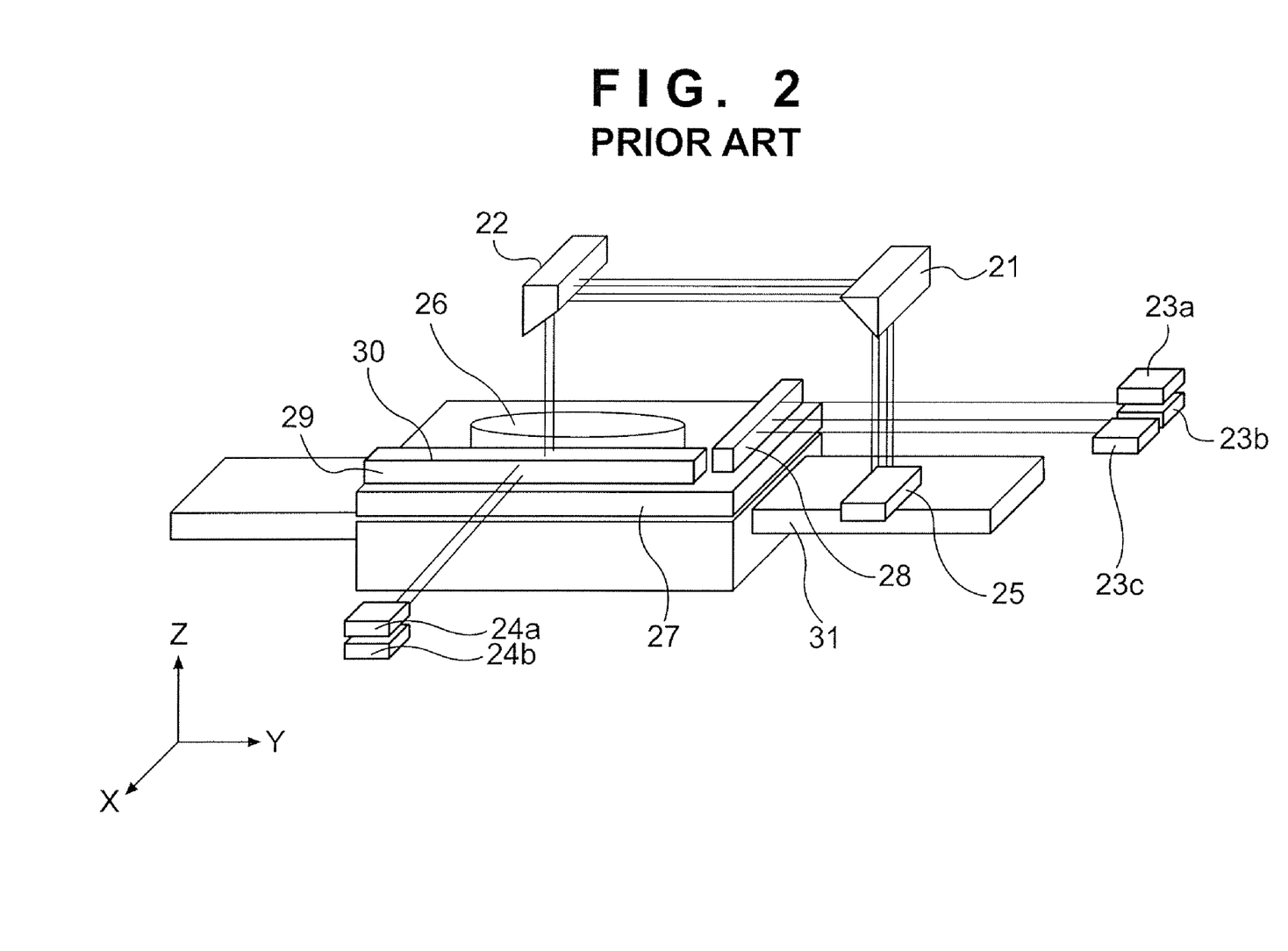
FIG. 2 is a diagram illustrating the usual configuration for stage position measurement by an interferometer.

FIG. 2 is a diagram illustrating an example of the usual configuration for an interferometer system that measures the position or the displacement of the top stage 27, using the laser interferometers 23, 24 and the Z measurement laser interferometer 25. In FIG. 2, a wafer, not shown, is placed on the wafer chuck 26. The top stage 27, which supports the wafer chuck 26, is moved by a guide and an actuator, not shown, in long strokes in the direction of the X and Y axes, as well as in short strokes in the direction of the Z axis, and in a direction of rotation in the ωX, ωY and θ directions. A Y-mirror 28 and an X-mirror 29 are mounted on the stop stage 27, and a Z-mirror 30 is combined with the top of the X-mirror 29 to form a single unit. The Y-mirror 28 is disposed so that its reflecting surface is perpendicular to the Y axis, the X-mirror 29 is disposed so that its reflecting surface is perpendicular to the X axis and the Z-mirror 30 is disposed so that its reflecting surface is parallel to the X-Y plane.

The Y-laser interferometer 23 is comprised of Y-interferometers 23a, 23b and 23c, each of which directs a laser beam parallel to the direction of the Y axis to predetermined positions on the reflecting surface of the Y-mirror 28, and from the reflected beam measures position change data in the direction in which the beams travel (that is, in the direction of the Y axis). The X-laser interferometer 24 is comprised of X-interferometers 24a and 24b, each of which directs a laser beam parallel to the direction of the X axis to predetermined positions on the reflecting surface of the X-mirror 29, and from the reflected beam measures position change data in the direction in which the beams travel (that is, in the direction of the X axis). The interferometers 23, 24 are fixedly supported by supports, not shown, that provide the measurement reference. For example, the Y-laser interferometer 23 and the X-laser interferometer 24 are fixedly mounted on the mirror barrel support 35 that forms a single integrated structure with the projection lens system 34.

The Z measurement laser interferometer (hereinafter the "Z-interferometer") 25 measures in the direction of the Z axis, and rests on the X-Y stage 31. The Z-interferometer 25 is disposed so that emitted light beams are either perpendicular to the X-Y plane or made to be perpendicular by optical elements such as mirrors, etc. In the arrangement shown in FIG. 2, the beams are made perpendicular by the first mirror 21 and the second mirror 22. In other words, the first and second mirrors 21, 22 direct the light beam emitted from the Z-interferometer 25 onto the Z-mirror 30, and are fixedly supported so as to present an acute-angle reflecting surface to the mirror barrel support 35 that provides the measurement reference or to the measurement beams from the Z-interferometer 25. The first mirror 21 and the second mirror 22 are elongated in the stroke direction (that is, in the direction of the X axis) of the moving part (the X-stage 31) on which the Z-interferometer 25 is installed.

In an exposure apparatus like that shown in FIG. 1, the mirror barrel is in the center of the mirror barrel support 35. In addition, the wafer chuck 26 is placed atop the top stage 27. Consequently, the redirection of the measurement beam path from the Z-interferometer 25 is limited by the need to keep clear of these units. Furthermore, the range of movement of the top stage 27 has a long stroke, and the mirrors 21, 22 and 30 all have long strokes, as well, in order to carry out measurement in the direction of the Z axis throughout the entire range of the stroke. However, elongation of the mirror creates the following problems:

In terms of manufacture and installation, it is difficult to achieve a nearly perfectly flat surface.

Even when it is possible to achieve a nearly perfectly flat surface, the cost is prohibitive.

As the characteristic value of the reflecting mirror decreases, the zone of control deteriorates.

In particular, the mirror barrel can block the laser beam paths of the mirrors 21, 22 during movement of the stage.

Figure 3:
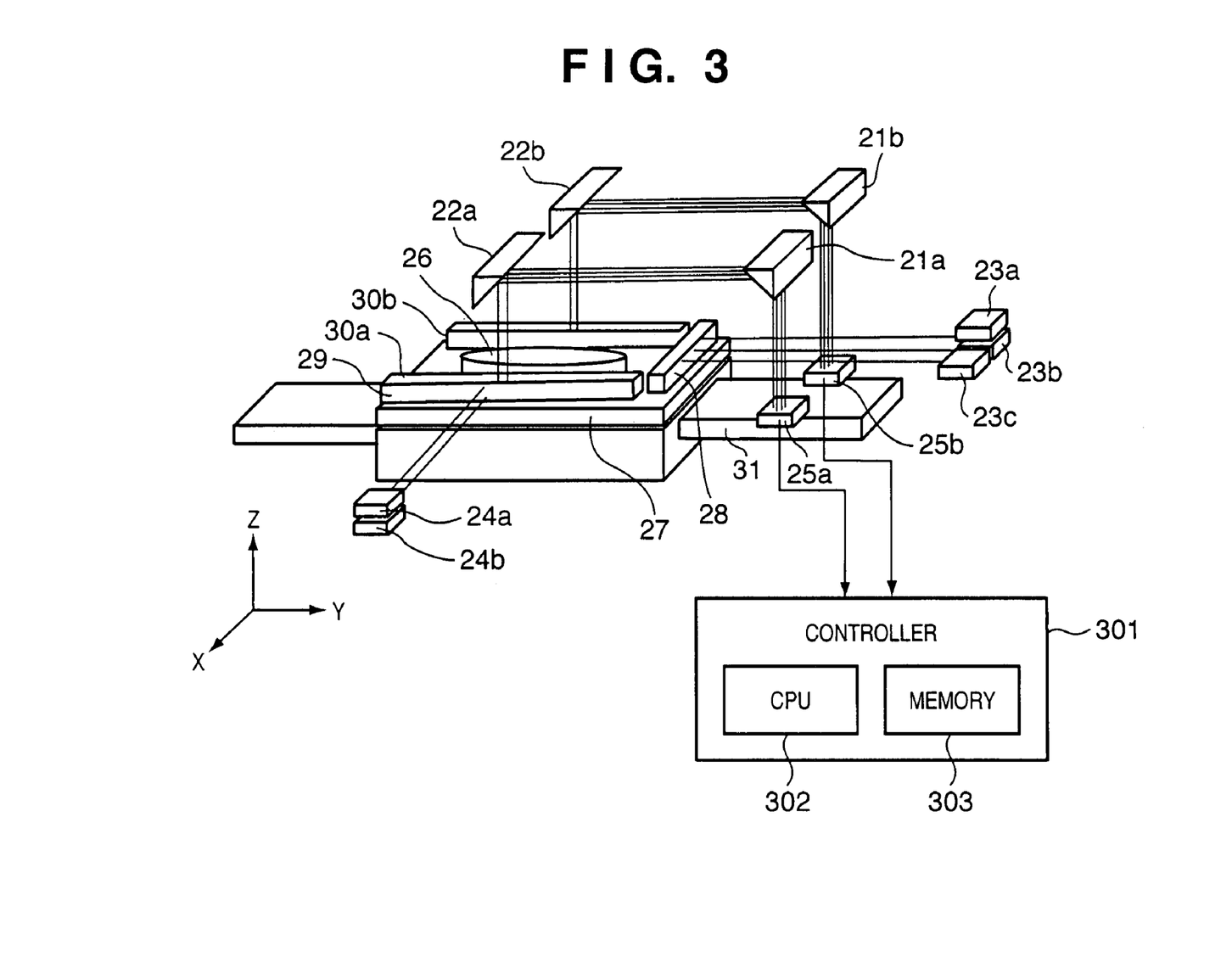
FIG. 3 is a schematic diagram showing interferometer switching measurements according to an embodiment of the present invention, adapted to the Z axis.

Accordingly, the present embodiment uses two Z-interferometer systems having overlapping measurement ranges, as shown in FIG. 3.

In FIG. 3, reference numerals 25a and 25b designate two different Z-interferometers for measuring position in the direction of the Z axis, both of which are placed on the X-Y stage. The Z-interferometers 25a, 25b are disposed so that light beams emitted from the Z-interferometers 25a, 25b are perpendicular to the X-Y plane or are made perpendicular by optical elements such as mirrors. In the present embodiment, the Z-interferometers 25a, 25b measure the position of the top stage 27 in the direction of the Z axis by directing the beams emitted from the Z-interferometers 25a, 25b onto the Z-mirrors 30a, 30b (reflecting surfaces parallel with the X-Y plane) mounted on the top stage 27 via the mirrors 21a, 21b, 22a, 22b mounted on the mirror barrel support 35. The Z-interferometer 25a, as well as the mirrors 21a, 221 and the Z-mirror 30a that form the laser beam path therefor, form a first measurement system. The Z-interferometer 25b, as well as the mirrors 21b, 22b and the Z-mirror 30b that form the laser beam path therefor, form a second measurement system. By detecting changes in the length of the path of the laser beam, the measurement system measure the positions of the top stage 27 (that is, the reflecting surface of the Z-mirror) in the direction of the Z axis.

In the present embodiment, by switching between the Z-interferometers 25a, 25b (switching between the first and second measurement systems) to measure the reflecting surfaces of the two Z-mirrors 30a, 30b depending on the state of movement of the top stage 27 (for example, the position of the stage), measurement of the top stage 27 in the direction of the Z axis can be carried out while avoiding obstacles, such as a lens mirror barrel of the projection lens 34, which block the measurement beams. In this switch, a controller 301 transfers measurements from the interferometer that has been measuring up to the present to the interferometer that from now on can measure. The position of the stage when the switch occurs is in a zone in which such a position can be measured by both Z-interferometers 25a, 25b (called an "overlapping measurement enabled zone"). At this time, the overlapping measurement enabled zone is designed so as to provide a switching time that enables switching even when the stage is in full movement. For example, although the rest time for the interferometer varies depending on the type of board, if, for example, the interferometer reset time is 100 µsec and the stage driving speed is 1000 mm/sec, then, while the interferometer is resetting, the stage has moved $100^{-6} \times 1000 = 0.1$ mm. In addition, the reset is necessary because, if the light path is once blocked, the interferometer must return to its original position. It should be noted that the controller 301 controls the entire exposure apparatus of the present embodiment, and in the present embodiment, is comprised, for example, of a CPU 302 and a memory 303. However, it goes without saying that, alternatively, a controller 301 dedicated to interferometer measurement control may be provided, part or all of whose processing may be implemented using dedicated hardware, an IC chip, or the like.

The position of the top stage 27 in the direction of the Z axis is obtained by adding the displacement of the laser interferometers 25a, 25b to an initial position of the top stage 27 (that is, a predetermined position when the interferometer is reset to zero when the apparatus itself is reset, for example, the position at which the top stage 27 contacts a lower mechanical stopper) that is stored in the memory 303 of the controller 301. However, the mirrors are not perfect planes, but have surfaces of different shapes, which is a cause of measurement error. In the present embodiment, in order to cope with the increasingly high accuracy of exposure processing in recent years, this type of measurement error due to surface shape is corrected.

Due to the surface shapes of the mirrors, the positions at which the laser beams strike the mirrors 21a, 21b, 22a, 22b, 30a and 30b differ depending on the X-Y coordinates of the top stage 27. In other words, the correction of the shape errors necessitates superimposing shape errors of a plurality of mirrors. Furthermore, depending on the X coordinate, there is switching from interferometer 25a to interferometer 25b, and from interferometer 25b to interferometer 25a.

First, in order to correct the shape error, it is necessary to measure the shape of each mirror in advance. The following describes a method of measuring the shape of the surface of a mirror.

Although, during exposure, the position of the top stage 27 in the direction of the Z axis is adjusted using measurements made by the Z-interferometers 25a, 25b, during measurement of the mirror surface shape, such adjustment is carried out using the Z-displacement sensor 43. First, the top stage 27 is moved to predetermined X-Y coordinates where it can be measured by the interferometer 25a. Then, while the position of the top stage 27 along the Z axis is kept at a predetermined constant by using the Z-displacement sensor 43, the top stage 27 is driven in the direction of the Y axis (the position in the direction of the X axis is fixed) and the displacement of the top stage 27 is measured by the Z-interferometer 25a, thus enabling the shape of the surface of the mirror 30a to be measured. In addition, by measuring displacement of the top stage 27 while driving the top stage 27 in the direction of the X axis (the Y axis is fixed), the shapes of the surfaces of the mirrors 21a and 22a can be measured in the form of the sum of the two. Similarly, by moving the top stage 27 to X-Y coordinates where it can be measured by the interferometer 25b and measuring the displacement of the top stage 27 while moving the top stage 27 in the direction of the Y axis, (the X axis is fixed), the shape of the surface of the mirror 30b can be measured, and by measuring the displacement of the top stage 27 while moving the top stage 27 in the X direction (the Y axis is fixed), the shapes of the surfaces of the mirrors 21b and 22b can be measured as a sum of the two.

Figure 4:
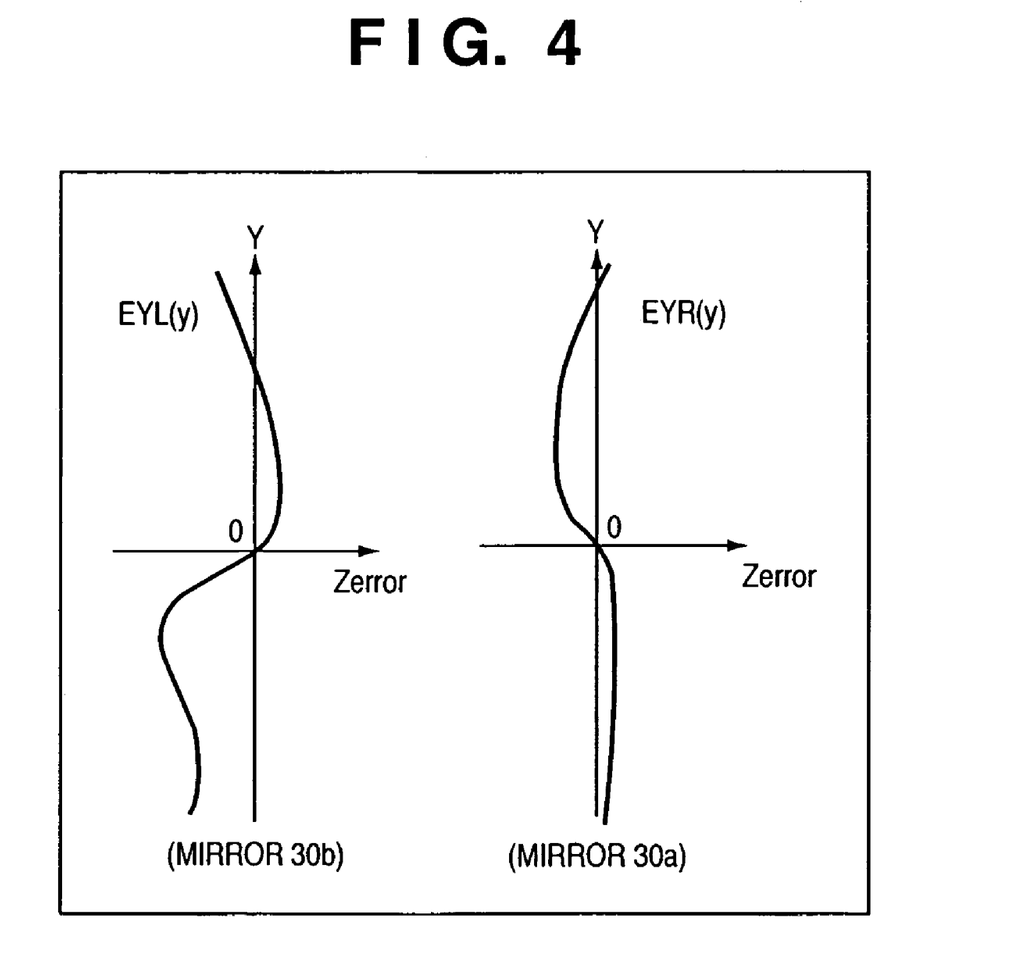
FIG. 4 is a schematic diagram showing mirror shape error according to an embodiment of the present invention.

FIG. 4 is a schematic diagram of a shape error according to the shapes of the surfaces of the mirrors 30a, 30b as measured by the method described above. The vertical axis is the Y coordinate of the top stage 27 and the horizontal axis indicates the extent of the shape error. In FIG. 4, EYR(y) is the shape error of mirror 30a and EYL(y) is the shape error of mirror 30b, expressed as functions of the Y coordinate. It should be noted that EYR(y) and EYL(y) are normalized to be zero at y=0.

Figure 5:
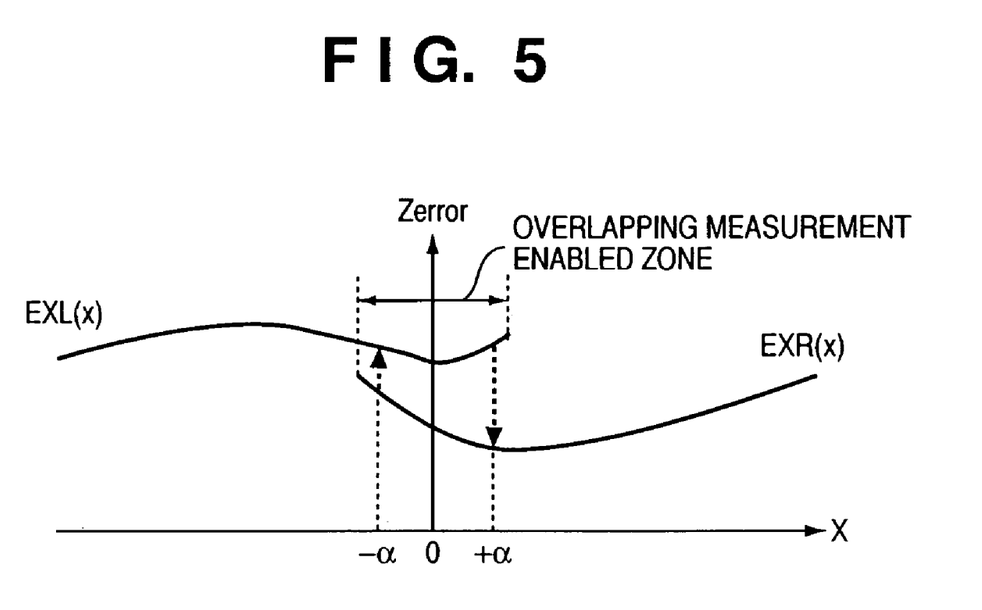
FIG. 5 is a schematic diagram showing mirror shape error according to an embodiment of the present invention.

In addition, FIG. 5 shows shape errors according to mirrors 21a and 22a, as well as shape errors according to mirrors 21b and 22b, as measured by the method described above. In FIG. 5, the horizontal axis indicates the X coordinate of the top stage 27 and the horizontal axis indicates the shape error. In addition, EXR(x) designates the error shape of mirror 21a+22a and EXL(x) designates the shape of mirrors 21b+22b, expressed as a function of the X coordinate. The error shapes of both FIG. 4 and FIG. 5 are stored on the memory 303 of the controller 301, in the form of a table, for example.

Next, a description will be given of switching Z-interferometers from 25a to 25b, or from 25b to 25a. If the X coordinate of the top stage 27 is greater than +α, the position of the top stage 27 in the direction of the Z axis is measured by the Z-interferometer 25a and the stage is adjusted accordingly. If the X coordinate of the top stage 27 is less than −α, the position of the top stage 27 in the direction of the Z axis is measured by the Z-interferometer 25b and the stage is adjusted accordingly.

When the top stage 27 is driven in a negative (−) direction from an X-axis position greater than +α, the top stage 27 enters a zone of overlapping measurement by Z-interferometer 25a and Z-interferometer 25b. At this point in time, measurement and control by the Z-interferometer 25a continues. Then, at point −α, the switch is made to Z-interferometer 25b. By contrast, when the top stage 27 is driven in a positive (+) direction from the X-axis position less than −α, the top stage 27 enters a zone of overlapping measurement by Z-interferometer 25a and Z-interferometer 25b. At this point in time, measurement and control by the Z-interferometer 25b continues. Then, at point +α, the switch is made to Z-interferometer 25a. Although in the present embodiment the switching positions of the +side and the −side are the same, they may be different values. In other words, provided −α and +α are within the overlapping measurement enabled zone, they may be of different values. However, because the top stage 27 is driven at a high speed, preferably, the setting of the position takes into account the switching time required by interferometer reset and a shape error correction process to be described later.

Next, a description will be given of a method of correcting mirror shape error in the Z position depending on the X-Y coordinates of the top stage 27. The controller 301 performs correction according to the following equations:

$$\Delta Zr = EXR(x) + EYR(y) \tag{1}$$

$$\Delta Zl = EXL(x) + EYL(y) \tag{2}$$

When measuring with Z-interferometer 25a:

$$Z = Za + \Delta Zr \tag{3}$$

When measuring the Z-interferometer 25b:

$$Z = Zb + \Delta Zl. \tag{4}$$

Here, Za, Zb are measurement values of the position of the top stage 27 in the direction of the Z axis by the Z-interferometers 25a, 25b, and Z is a corrected measurement value of the position of the top stage 27.

In other words, when adjusting the position of the top stage 27 in the direction of the Z axis using the Z-interferometer 25a, it is sufficient to correct for Δ Zr, which is the combined shape error of mirrors 21a, 22a and 30a. When adjusting the position of the top stage 27 in the direction of the Z axis using the Z-interferometer 25b, it is sufficient to correct for ΔZl, which is the combined shape error of mirrors 21b, 22b and 30b. Accordingly, when measuring the position of the top stage 27 in the direction of the Z axis using each of the Z-interferometers 25a, 25b, the exact position of the top stage 27 in the direction of the Z axis can be obtained by correcting the measurements taken using equations (3) and (4) described above.

Figure 6:
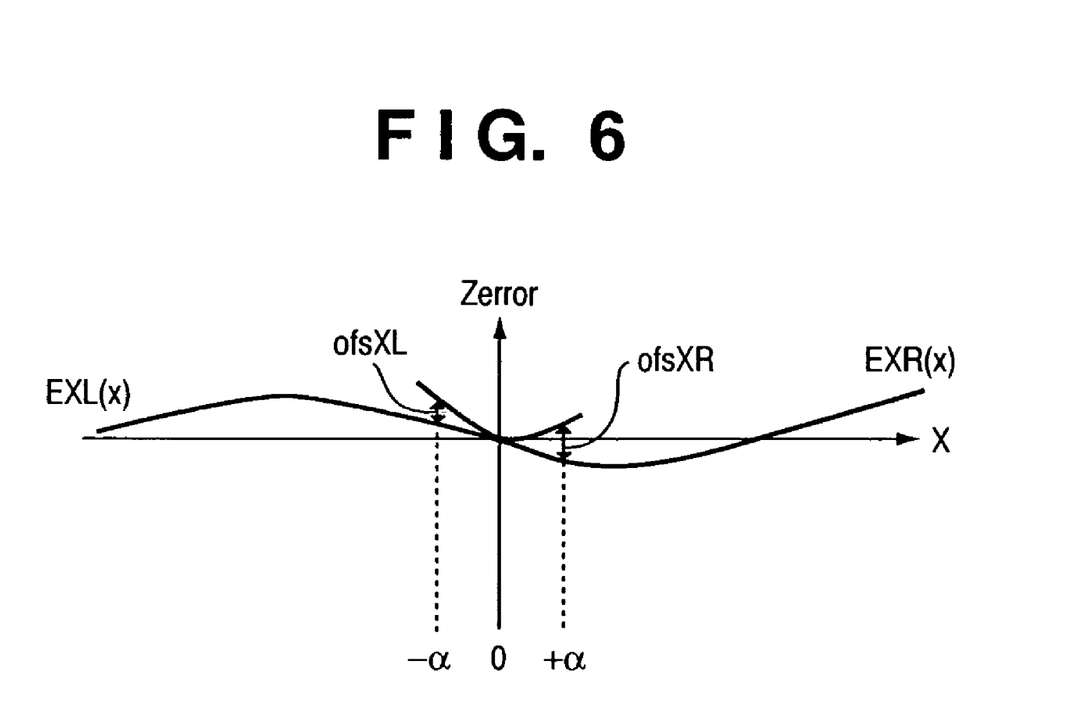
FIG. 6 is a schematic diagram showing mirror shape error according to an embodiment of the present invention.

FIG. 6 shows a case in which the EXR(x) and the EXL(x) shown in FIG. 5 have been normalized so that, when x=o, the error is zero. From FIG. 6, it can be seen that, at the position at which the interferometers are switched, there is a difference between the shape errors EXR(x) and EXL(x). In other words, when the switch is performed from Z-interferometer 25a to Z-interferometer 25b, there is a difference of ofsXK, and when the switch is made from Z-interferometer 25b to Z-interferometer 25a, there is a difference of ofsXR, where ofsXR and ofsXL are obtained as follows:

If, from equations (5) and (6), (+α) and (−α) are constants (that is, the X coordinate is fixed), then ofsXR and ofsXL are fixed values regardless of the Y coordinate of the top stage 27.

In addition, with respect to the EYR(y) and the EYL(y), shown in FIG. 4, as well, a difference likewise appears when switching interferometers. In this case, although the difference does not depend on the direction of interferometer switching (whether from 25a to 25b or from 25b to 25a), it is, nevertheless, a variable that changes according to the Y coordinate of the top stage 27 when the switch is performed. In other words, the difference ofsY is obtained by the following equation:

$$ofsY = EYR(y) - EYL(y). \tag{7}$$

Thus, as described above, due to differences in the shapes of the mirrors of the two measurement systems, differences arise in the lengths of the paths of the laser beams. If these differences are not taken into account when switching interferometers, for example, if measurement value Za made by the Z-interferometer 25a is simply inherited as a measurement value Zb made by Z-interferometer 25b, then a discontinuity will occur in the position of the top stage 27 along the Z axis and proper correction will become impossible. As a result, the apparatus will be out of focus during exposure.

In addition, with repeated switching between interferometers, errors in the Z-position of the top stage 27 will be accumulated.

Accordingly, when switching interferometers, it is necessary that the Z-position measured by the interferometer that has become effective as the new control axis inherit the Z-position measured by the previously effective interferometer and the values obtained from equations (5)-(7). That sort of succession is implemented by the flowing equations, that is, when $x=-\alpha$ (when switching from 25a to 25b):

$$Zb=Za+ofsXL+ofsY \qquad (8),$$

and when $x=+\alpha$ (when switching from 25b to 25a):

$$Za=Zb-ofsXL-ofsY. \qquad (9)$$

In this case, Za designates the Z-position obtained from Z-interferometer 25a and 25b designates the Z-position obtained from Z-interferometer 25b.

Thus, as described above, correction of shape errors in the mirrors can be correctly continued even when switching interferometers.

Figure 7:
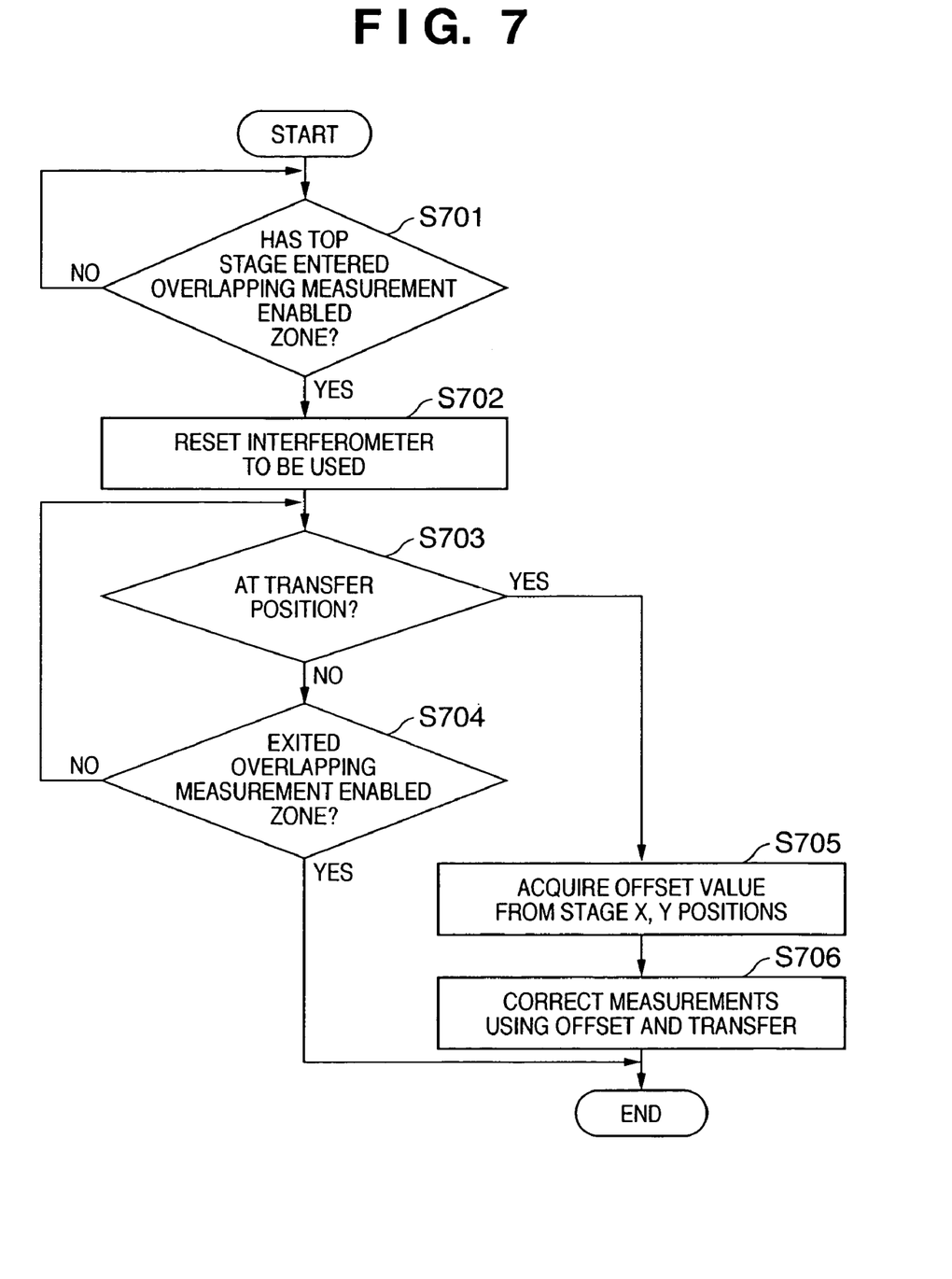
FIG. 7 is a flow chart diagram illustrating an interferometer continuation operation according to an embodiment of the present invention.

The foregoing process will now be described with reference to the flow chart shown in FIG. 7. It should be noted that the process shown in FIG. 7 is implemented by the CPU 302 of the controller 301 executing a control program stored in the memory 303. The EXR(x), EXL(x), EYR(y) and EYL(y) shown in FIG. 4 and FIG. 5 are measured in advance by the technique described above, and stored in the memory 303 in the form of a table. Of course, either x or y may be stored as functions, and calculated as needed from the X-Y coordinates of the stage position.

First, from the X-Y coordinates position of the top stage 27, it is determined whether or not the stage has entered the overlapping measurement enabled zone. If the stage has entered the overlapping measurement enabled zone, then the operation of resetting the laser interferometer that has not yet been used is started. Thereafter, it is determined whether or not the stage has reached a transfer position. As described above, the transfer position differs depending on whether the laser interferometer currently in use is interferometer 25a or 25b. If laser interferometer 25a is currently in use, then the transfer position is $-\alpha$, as shown in FIG. 5. If laser interferometer 25b is currently in use, then the transfer position is $+\alpha$, as shown in FIG. 5. If the stage leaves the overlapping measurement enabled zone before reaching the transfer position (such as when the stage has entered the overlapping measurement enabled zone, but is then retreated, for example), then the process terminates (in other words, the process is repeated from step S701).

If the stage has reached the transfer position, the process proceeds from step S703 to step S705 and an offset value is acquired from the X, Y positions of the stage at that point in time using equations (5)-(7). If the laser interferometer 25a is being used, ofsXL is acquired from equation (6). If the laser interferometer 25b is being used, ofsXR is acquired using equation (5). Then, in step S706, as the laser interferometer in use is switched, the measurements are continued using either equation (8) or (9).

Thus, as described above, according to the present embodiment, in order to accommodate the movement of the stage in the direction of the X and Y axes, when using a measurement system that includes a reflecting mirror elongated in the X direction and a reflecting mirror elongated in the Y direction, it is possible to reflect the mirror surface shapes in each direction in the measurements, and, moreover, measurements can be correctly continued even when switching laser interferometers, thus improving measurement accuracy dramatically.

It should be noted that, although in the present embodiment, the Z-interferometers are placed on the X-stage, alternatively, these interferometers may be placed on the Y stage instead. In addition, although in the present embodiment, only one or two interferometer systems are provided on the top stage 27, the present invention is not limited to such an arrangement, and may be provided with three or more such systems. If measurement is carried out at three places, then it is possible to obtain not only the displacement of the top stage 27 (which takes as its reference the mirror barrel support 35) in the direction of the Z axis, but also top stage 27 tilt ($\omega X$, $\omega(Y)$ rotation data as well.

In addition, although in the present embodiment, the present invention is adapted to the wafer stage, the present invention can also be adapted to the reticle stage. Moreover, although in the present embodiment, the Z-displacement sensor 43 is used when measuring the shapes of the surfaces of the mirrors, alternatively, a focus sensor specially provided inside the exposure apparatus may be used instead. In addition, although specific shape errors are stored in the memory 303 of the controller 301 as tables, preferably, the interval between table values is small. Moreover, linear interpolation and higher-order function interpolation may be performed between table values. In addition, as can be understood by those of ordinary skill in the art, the present invention is not limited to measurement in the Z direction, but can be adapted to any system in which interferometer switching is performed in any direction.

As explained above, according to the above embodiments, correcting the measurements of the laser interferometers using reflecting mirror surface shape data reduces misalignment when switching between interferometers.

As many apparently widely different embodiments of the present invention can be made without departing from the spirit and scope thereof, it is to be understood that the invention is not limited to the specific preferred embodiments described above thereof, except as defined in the claims.

CLAIM OF PRIORITY

This application claims priority from Japanese Patent Application No. 2004-054634, filed on Feb. 27, 2004, which is hereby incorporated by reference herein.

What is claimed is:

1. A stage apparatus comprising:

a stage movable in a first direction and a second direction, different from the first direction, the first and second directions being a horizontal direction;

first and second measurement systems each having a laser interferometer and a mirror system including a first reflecting mirror elongated in the first direction and a second reflecting mirror elongated in the second direction, and measuring a position of the stage with respect to a vertical direction based on measurement of a length of a laser beam light path formed by the mirror system;

a switching unit configured to transfer a measurement value from the first measurement system in use to the second measurement system and to switch the measurement system in use from the first measurement system to the second measurement system within an overlapping zone in which said first and second measurement system simultaneously measure the position of the stage; and a first correcting unit configured to correct the measurement value transferred by the switching unit, based on a difference in the length of the light path due to shapes of surfaces of the first and second reflecting mirrors of the first and second measurement systems.

2. The apparatus according to claim 1, further comprising a memory unit configured to store shape data indicating the shape of the surface of the first reflecting mirror in the first direction and the shape of the second reflecting mirror in the second direction, with respect to each of the first and second measurement systems,
wherein said first correcting unit references the shape data and acquires the difference in the lengths of the light paths due to the shape of the surface of the first and second reflecting mirrors of the first and second measurement systems.

3. The apparatus according to claim 2, further comprising a second correcting unit configured to correct a measurement value obtained by the laser interferometer of the measurement system currently in use of the first and second measurement systems, based on the shape data and the position of the stage in the first and second directions.

4. The apparatus according to claim 2, wherein the shape data comprise functions indicating an amount of a change in position of the surface of the first and second reflecting mirrors in the first and second directions, respectively.

5. The apparatus according to claim 2, wherein the shape data comprise tables correlating positions in the first and second directions and the amount of the change in position of the surfaces of the first and second reflecting mirrors at the positions, respectively.

6. A control method for a stage apparatus, comprising (i) a stage movable in a first direction and a second direction, different from the first direction, the first and second directions being horizontal directions and (ii) first and second measurement systems each having a laser interferometer and a mirror system including a first reflecting mirror elongated in the first direction and a second reflecting mirror elongated in the second direction, and measuring a position of the stage with respect to a vertical direction based on measurement of a length of laser beam light path formed by the mirror system, the method comprising:

a switching step of transferring a measurement value from the first measurement system in use to the second measurement system and switching the measurement system in use from the first measurement system to the second measurement system within an overlapping zone in which the first and second measurement systems simultaneously measure the position of the stage;

a correcting step of correcting the measurement value transferred by the switching unit, based on a difference in the length of the light path due to shapes of surfaces of the first and second reflecting mirrors of the first and second measurement systems; and a control step of controlling the stage using a measurement value obtained by the second measurement system using the transferred measurement value corrected in the correcting step.

* * * * *